(12) United States Patent
Lee et al.

(10) Patent No.: US 9,989,860 B2
(45) Date of Patent: Jun. 5, 2018

(54) METHOD OF GENERATING A PATTERN ON A PHOTOMASK USING A PLURALITY OF BEAMS AND PATTERN GENERATOR FOR PERFORMING THE SAME

(71) Applicant: SAMSUNG ELECTRONICS CO., LTD., Suwon-si, Gyeonggi-Do (KR)

(72) Inventors: Sang-Hee Lee, Seongnam-si (KR); Hyun-Seok Uhm, Hwaseong-si (KR); Il-Yong Jang, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/255,925

(22) Filed: Sep. 2, 2016

(65) Prior Publication Data
US 2017/0115577 A1    Apr. 27, 2017

(30) Foreign Application Priority Data
Oct. 21, 2015  (KR) .......................... 10-2015-0146473

(51) Int. Cl.
G03B 27/68 (2006.01)
G03F 7/20 (2006.01)
G03F 1/22 (2012.01)
G03F 1/20 (2012.01)

(52) U.S. Cl.
CPC ............ G03F 7/70283 (2013.01); G03F 1/20 (2013.01); G03F 1/22 (2013.01)

(58) Field of Classification Search
CPC .... G03F 7/70283; G03F 7/20; G03F 7/70775; G03F 7/70425

USPC .......................... 355/52, 53, 55, 67
See application file for complete search history.

(56) References Cited

U.S. PATENT DOCUMENTS

| | | | |
|---|---|---|---|
| 7,538,867 B2 | 5/2009 | Murai | |
| 7,657,863 B2 * | 2/2010 | Iijima | ................... B82Y 10/00 |
| | | | 250/492.2 |
| 7,674,574 B2 | 3/2010 | Liang et al. | |
| 8,404,408 B2 | 3/2013 | Lee et al. | |
| 8,611,637 B2 | 12/2013 | Shi et al. | |
| 8,964,173 B2 | 2/2015 | Ahn et al. | |
| 2003/0093767 A1 * | 5/2003 | Murai | ................... B82Y 10/00 |
| | | | 430/30 |
| 2006/0276778 A1 | 12/2006 | Sink | |

(Continued)

FOREIGN PATENT DOCUMENTS

| | | |
|---|---|---|
| JP | 06-204308 | 7/1994 |
| JP | 2009-081243 | 4/2009 |

(Continued)

*Primary Examiner* — Hung Henry Nguyen
(74) *Attorney, Agent, or Firm* — F. Chau & Associates, LLC.

(57) ABSTRACT

A pattern generating method includes, generating a first bit map from inputted pattern data. Characteristics of a plurality of beams for exposing a pattern on a substrate are analyzed, each of the plurality of beams being designated to correspond to one of a plurality of grids in the first bit map. The pattern data is corrected such that at least one of the plurality of beams is designated to expose at least a portion of the pattern on the substrate. A second bit map is generated from the corrected pattern data. The substrate is patterned using the plurality of beams according to the designation of the second bit map.

14 Claims, 8 Drawing Sheets

(56) References Cited

U.S. PATENT DOCUMENTS

2009/0199152 A1    8/2009  Sjostrom
2012/0252215 A1*  10/2012  Abe .......................... G03F 1/36
                                                          438/694
2014/0272685 A1    9/2014  Sandstrom

FOREIGN PATENT DOCUMENTS

| JP | 2009-244488 | 10/2009 |
| JP | 2010-079112 | 4/2010 |
| JP | 2010-103177 | 5/2010 |
| JP | 2014-029378 | 2/2014 |
| JP | 2015-052738 | 3/2015 |

* cited by examiner

PATTERN1
SIZE a1, POSITION x1,y1
PATTERN2
SIZE a2, POSITION x2,y2

PATTERN3
SIZE a3, POSITION x3,y3
PATTERN4
SIZE a4, POSITION x4,y4

| 1 | 10 | 8 | 6 | 4 | 2 | 11 | 9 | 7 | 5 | 3 | 1 | 10 |
|---|----|---|---|---|---|----|---|---|---|---|---|----|
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |

|   |   |   |   |   |   |   |   |   |   |   |   |
|---|---|---|---|---|---|---|---|---|---|---|---|
|   | 0.5 | 1 | 1 | 1 | 1 | 1 | 1 | 1 | 1 | 1 | 0.5 |
|   | 0.5 | 1 | 1 | 1 | 1 | 1 | 1 | 1 | 1 | 1 | 0.5 |
|   |   |   | 1 | 0.8 |   |   | 0.8 | 0.8 |   |   |   |
|   |   |   | 1 | 0.8 | 0.1 | 0.5 |   | 0.8 | 0.8 |   |   |
|   |   |   | 1 | 0.8 | 0.1 | 1 |   | 0.8 | 0.8 |   |   |
|   |   |   | 1 | 0.8 | 0.1 | 1 |   | 0.8 | 0.8 |   |   |
|   |   |   | 0.9 | 0.4 | 0.1 | 1 |   | 0.8 | 0.8 |   |   |
|   |   |   |   |   | 0.1 | 1 |   |   |   |   |   |
|   |   |   |   |   | 0.1 | 1 |   |   |   |   |   |
|   |   |   |   |   | 0.1 | 0.5 |   |   |   |   |   |

PATTERN1
SIZE a1, POSITION x1',y1'

PATTERN2
SIZE a2, POSITION x2',y2'

PATTERN3
SIZE a3, POSITION x3',y3'

PATTERN4
SIZE a4, POSITION x4',y4'

FIG. 11

| 1 | 10 | 8 | 6 | 4 | 2 | 11 | 9 | 7 | 5 | 3 | 1 | 10 |
|---|----|---|---|---|---|----|---|---|---|---|---|----|
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |
| 1 | 10 | 8 | 6 | 4 | 2 | 11 | 9 | 7 | 5 | 3 | 1 | 10 |

METHOD OF GENERATING A PATTERN ON A PHOTOMASK USING A PLURALITY OF BEAMS AND PATTERN GENERATOR FOR PERFORMING THE SAME

CROSS-REFERENCE TO RELATED APPLICATION(S)

This application claims priority under 35 U.S.C. § 119 to Korean Patent Application No. 10-2015-0146473, filed on Oct. 21, 2015, in the Korean Intellectual Property Office (KIPO), the contents of which are herein incorporated by reference in their entirety.

TECHNICAL FIELD

Exemplary embodiments of the inventive concept relate to a method of generating a pattern and a pattern generator for performing the same. More particularly, exemplary embodiments of the inventive concept relate to a method of generate a pattern on a photomask using a plurality of exposure beams and a pattern generator for performing the same.

DISCUSSION OF THE RELATED ART

When a pattern is generated on a mask, reticle, substrate, wafer or panel by conventional pattern generators, defects may be caused by visual or non-visual variations in light intensity. The defects may be referred to as mura. For example, in production of a photomask of a relatively large area, which may be 1220 mm×1400 mm, a defect, such as mura, may be reduced through various exposure methods, e.g., multiple passes, beam pitch matching, etc. However, these exposure methods may reduce production speed and throughput, and may increase production costs.

SUMMARY

According to an exemplary embodiment of the inventive concept, a pattern generating method includes generating a first bit map from inputted pattern data. Characteristics of a plurality of beams for exposing a pattern on a substrate are analyzed, each of the plurality of beams being designated to correspond to one of a plurality of grids in the first bit map. The pattern data is corrected such that at least one of the plurality of beams is designated to expose at least a portion of the pattern on the substrate. A second bit map is generated from the corrected pattern data. The substrate is patterned using the plurality of beams according to the designation of the second bit map.

In an exemplary embodiment of the inventive concept, analyzing the characteristics of the plurality of beams includes generating the plurality of beams which is designated to correspond to each of the grids in the first bit map, detecting characteristics of each of the generated plurality of beams, and selecting at least one of the plurality of beams which has a characteristic value that is equal to or greater than a predetermined characteristic value.

In an exemplary embodiment of the inventive concept, analyzing the characteristics of the plurality of beams includes analyzing a beam intensity, or a position and size of a beam spot, for each of the plurality of beams.

In an exemplary embodiment of the inventive concept, correcting the pattern data includes correcting pattern information in the pattern data such that the at least one of the plurality of beams is set to correspond to a predetermined grid of the second bit map.

In an exemplary embodiment of the inventive concept, the predetermined grid of the second bit map corresponds to a portion of the pattern to be scanned by the at least one of the plurality of beams, wherein the at least one of the plurality of beams has a characteristic value equal to or greater than a predetermined characteristic value.

In an exemplary embodiment of the inventive concept, in the pattern data, the pattern information includes information about a position of the pattern or a size of the pattern.

In an exemplary embodiment of the inventive concept, generating the first bit map includes dividing the pattern data into the plurality of grids, and binarizing each of the grids to correspond to the pattern.

In an exemplary embodiment of the inventive concept, patterning the substrate using the plurality of beams includes designating the plurality of beams, respectively, to correspond to the grids arranged in one row in the second bit map, and scanning the beams along a direction parallel with scan lines through a sweep.

In an exemplary embodiment of the inventive concept, each grid in the first bit map represents information of one of the plurality of beams to be scanned and the intensity of the one of the plurality of beams.

In an exemplary embodiment of the inventive concept, patterning the substrate using the plurality of beams includes exposing a photosensitive layer on the substrate with the plurality of beams.

According to an exemplary embodiment of the inventive concept, a pattern generating method includes analyzing characteristics of a plurality of beams configured to expose a substrate at predetermined positions according to inputted pattern data. The pattern data is corrected such that at least one of the plurality of beams is designated to expose at least a portion of a pattern on the substrate. The substrate is patterned by exposing the substrate with the plurality of beams according to corrected positions of the plurality of beams, wherein the corrected positions of the plurality of beams are determined using the corrected pattern data.

In an exemplary embodiment of the inventive concept, analyzing the characteristics of the plurality of beams includes generating the plurality of beams, detecting characteristics of the generated plurality of beams, and selecting at least one of the plurality of beams which has a characteristic value that is equal to or greater than a predetermined characteristic value.

In an exemplary embodiment of the inventive concept, analyzing the characteristics of the plurality of beams includes analyzing a beam intensity, or a position and size of a beam spot, for each of the plurality of beams.

In an exemplary embodiment of the inventive concept, correcting the pattern data includes generating a digital file format from the pattern data, the digital file format including information of each of the plurality of beams, wherein each of the plurality of beams is set to correspond to one of a plurality of grids of a first bit map. The predetermined positions correspond to the plurality of grids of the first bit map. Pattern information in the pattern data is corrected such that the at least one of the plurality of beams is designated to correspond to one of a plurality of predetermined grids of a second bit map. The second bit map includes the corrected positions of the plurality of beams.

In an exemplary embodiment of the inventive concept, correcting the pattern data includes generating a first bit map from the pattern data, the first bit map including characteristics of each of the plurality of beams, wherein the plurality of beams is set to correspond to a plurality of grids of the first bit map, respectively. Pattern information in the pattern data is corrected to generate a second bit map, the second bit map including the characteristics of each of the plurality of beams, wherein the plurality of beams is set to correspond to a plurality grids of the second bit map, respectively. The first bit map and the second bit map are compared, and one of the first and second bit maps is selected to expose an edge of the pattern, wherein the selected first or second bit map includes the beam having a characteristic value that exceeds a predetermined characteristic value by a greater value than any of the other beams of the plurality of beams.

According to an exemplary embodiment of the inventive concept, a pattern generating method includes generating first pattern data of a pattern, wherein the first pattern data includes coordinate values of a profile of the pattern. Characteristic values of each of a plurality of laser beams for exposing the pattern on a mask are determined, wherein a characteristic value of a first laser beam of the plurality of laser beams is determined to be smaller than a predetermined threshold value, and a characteristic value of a second laser beam of the plurality of laser beams is determined to be equal to or greater than the predetermined threshold value. A first bit map is generated using the first pattern data, wherein the first laser beam is designated to correspond to a first grid of the first bit map, and the second laser beam is designated to correspond to a second grid of the first bit map, wherein the first grid of the first bit map corresponds to a first portion of the pattern, and the second grid of the first bit map corresponds to a second portion of the pattern. Second pattern data is generated, wherein the second pattern data includes coordinate values of the profile of the pattern that are changed with respect to the coordinate values of the profile of the pattern included in the first pattern data. A second bit map is generated using the second pattern data, wherein, in the second bit map, the first laser beam is designated to correspond to a first grid of the second bit map, and the second laser beam is designated to correspond to a second grid of the second bit map, wherein the second grid of the second bit map correspond to the first portion of the pattern. The substrate is patterned using the plurality of beams according to the designations of the second bit map.

In an exemplary embodiment of the inventive concept, the first portion of the pattern is an edge of the pattern.

In an exemplary embodiment of the inventive concept, the second laser beam is further designated to correspond to a third grid of the second bit map.

In an exemplary embodiment of the inventive concept, the second and third grids of the second bit map are arranged in a row that excludes the first grid of the second bit map.

BRIEF DESCRIPTION OF THE DRAWINGS

The inventive concept will become more clearly understood from the following detailed description thereof with reference to the accompanying drawings, in which:

FIG. 11 is a plan view illustrating a second bit map generated from the second pattern data.

DETAILED DESCRIPTION OF THE EMBODIMENTS

Figure 1:
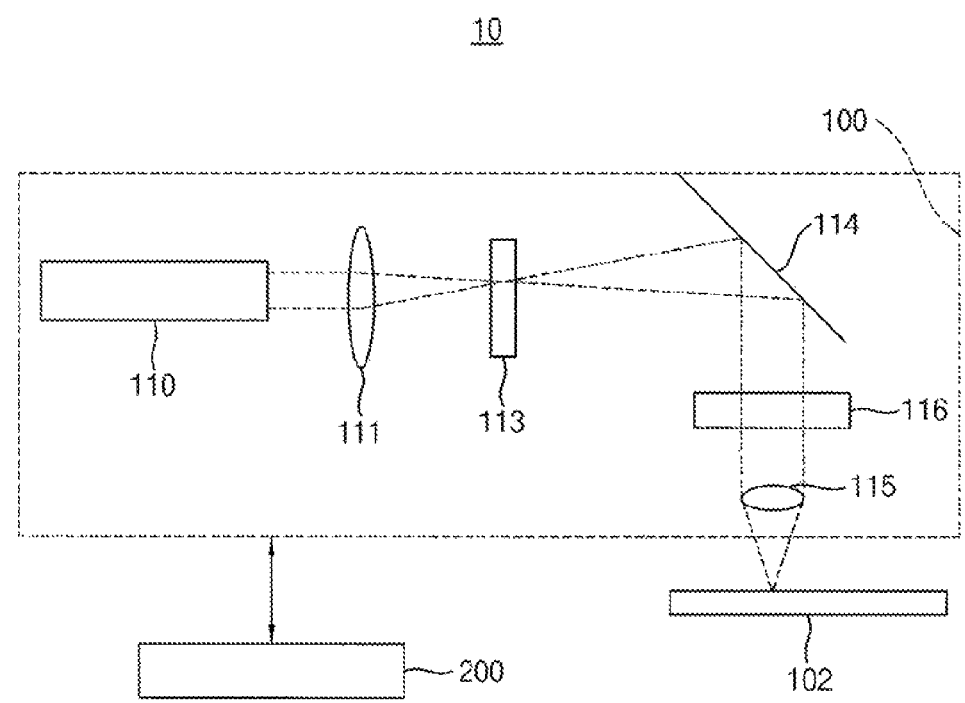
FIG. 1 is a block diagram illustrating a pattern generator in accordance with an exemplary embodiment of the inventive concept.

Various exemplary embodiments of the inventive concept will be described more fully hereinafter with reference to the accompanying drawings. The inventive concept may, however, be embodied in many different forms, and should not be construed as limited the exemplary embodiment thereof set forth herein. In the drawings, the sizes and relative sizes of components or elements may be exaggerated for clarity.

It will be understood that when an element or layer is referred to as being "on," "connected to" or "coupled to" another element or layer, it may be directly on, connected or coupled to the other element or layer, or intervening elements or layers may be present. Like numerals may refer to like elements throughout the specification. As used herein, the term "and/or" may include any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" may include the plural forms as well, unless the context clearly indicates otherwise.

Hereinafter, an exemplary embodiment of the inventive concept will be explained in detail with reference to the accompanying drawings.

Figure 2:
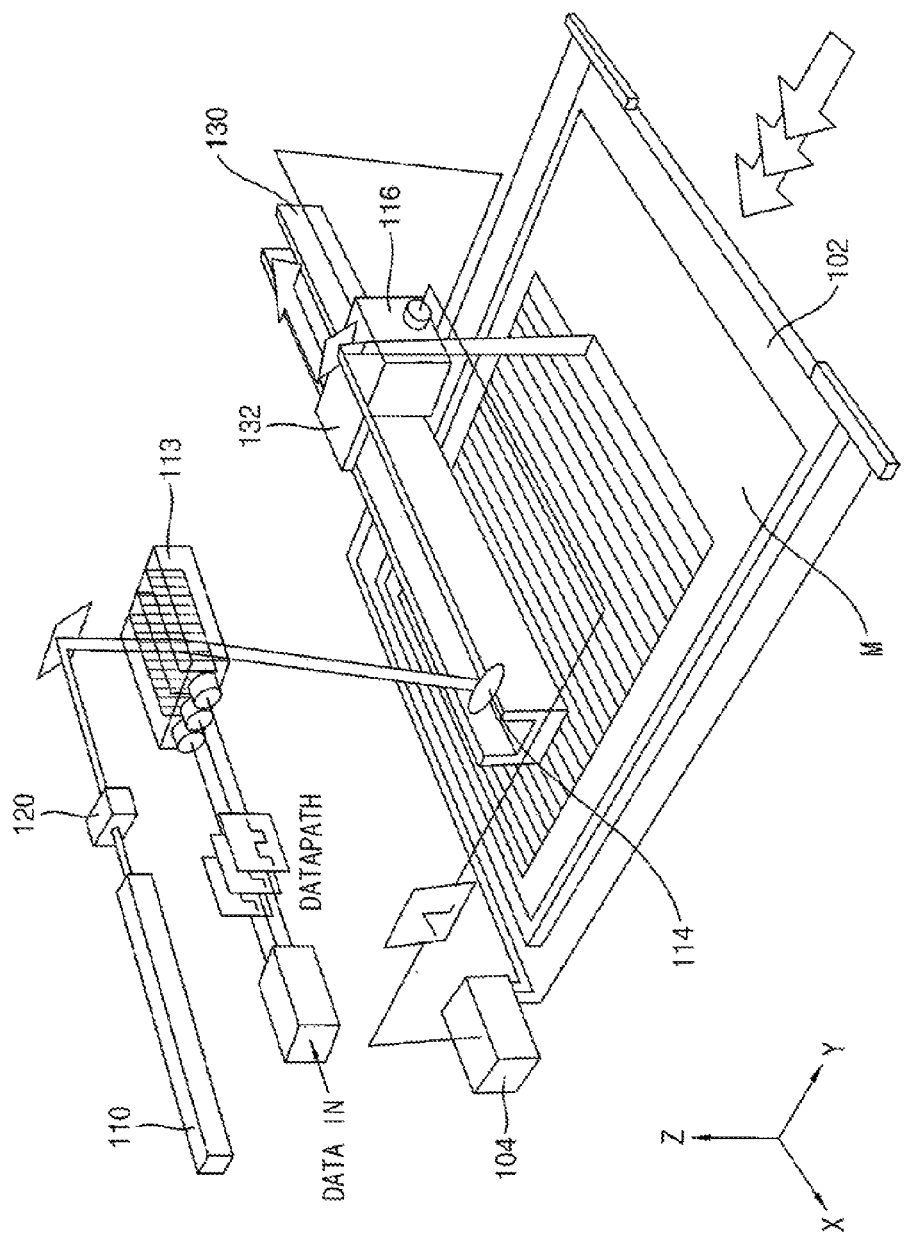
FIG. 2 is a perspective view illustrating a portion of the pattern generator in FIG. 1, according to an exemplary embodiment of the inventive concept.
Figure 3:
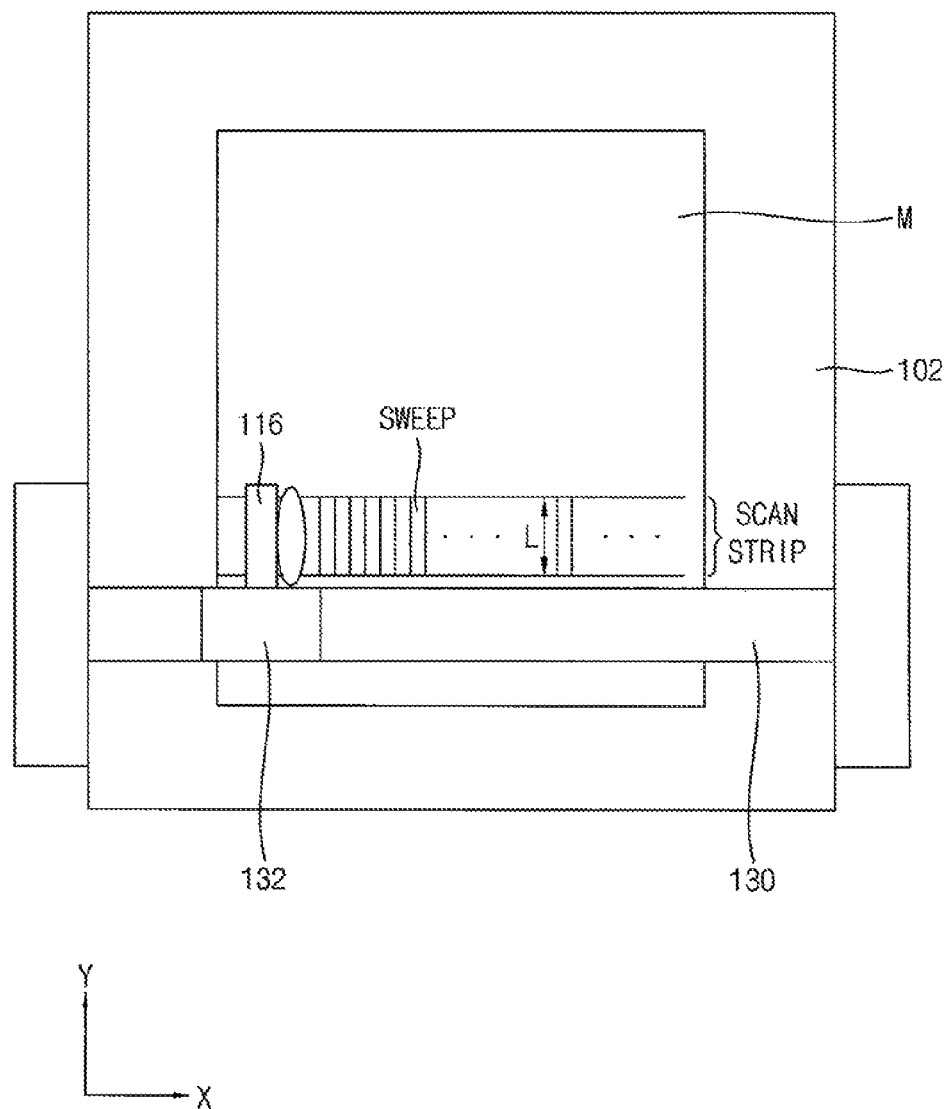
FIG. 3 is a plan view illustrating a pattern generated by the pattern generator in FIG. 1, according to an exemplary embodiment of the inventive concept.
Figure 4:
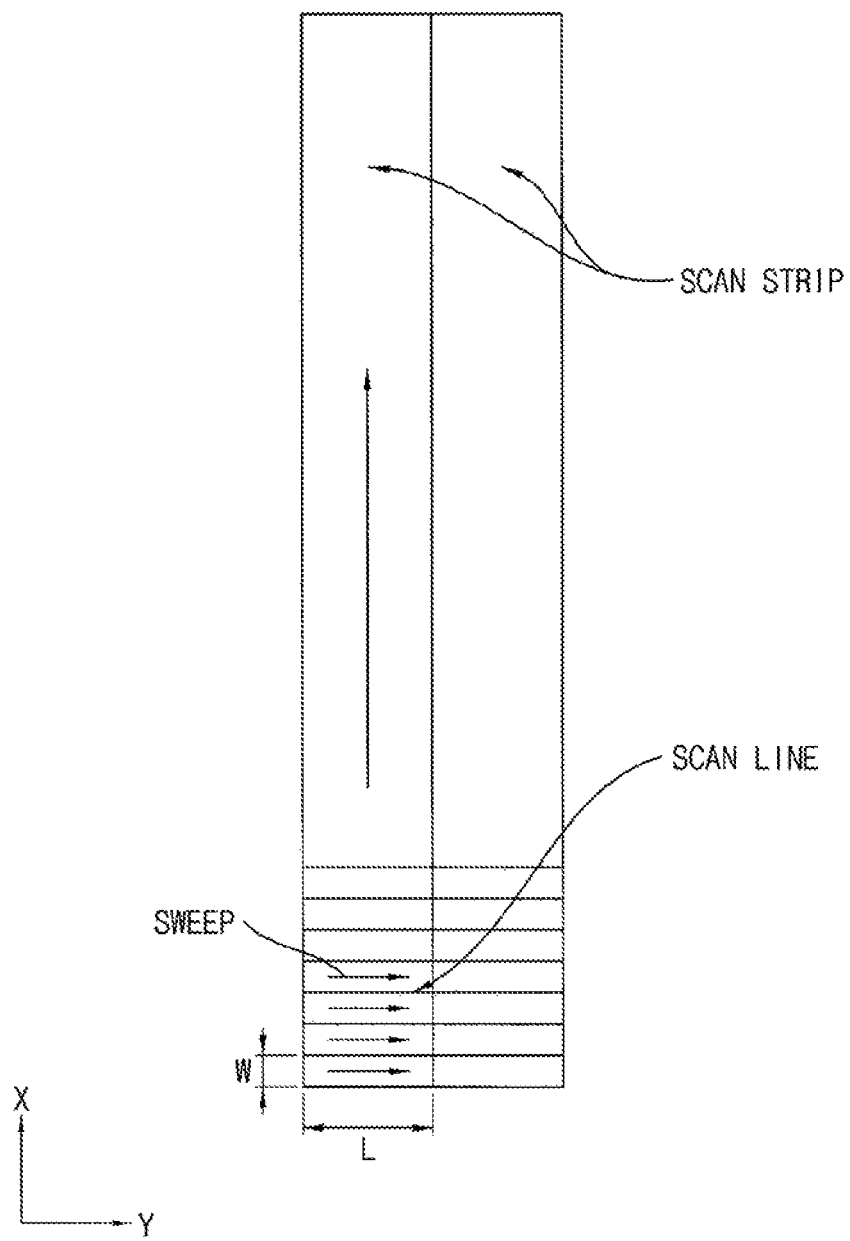
FIG. 4 is a plan view illustrating a plurality of scan strips generated by a portion of a scanning operation of the pattern generator in FIG. 1, according to an exemplary embodiment of the inventive concept.
Figure 5:
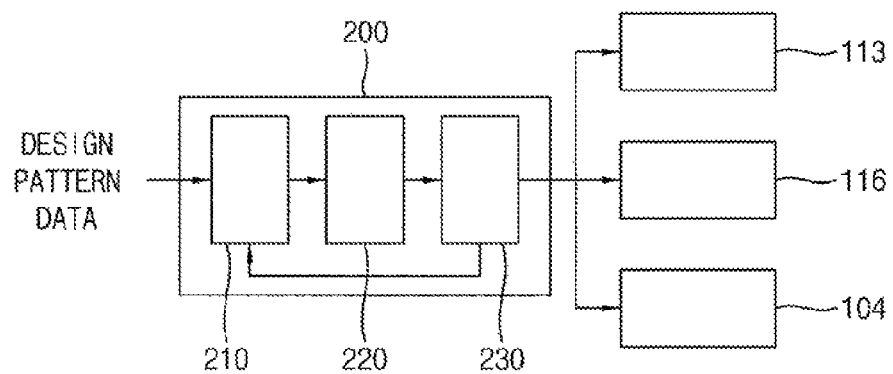
FIG. 5 is a block diagram illustrating a control unit of the pattern generator in FIG. 1, according to an exemplary embodiment of the inventive concept.

FIG. 1 is a block diagram illustrating a pattern generator in accordance with an exemplary embodiment of the inventive concept. FIG. 2 is a perspective view illustrating a portion of the pattern generator in FIG. 1, according to an exemplary embodiment of the inventive concept. FIG. 3 is a plan view illustrating a pattern generated by the pattern generator in FIG. 1, according to an exemplary embodiment of the inventive concept. FIG. 4 is a plan view illustrating a plurality of scan strips generated by a portion of a scanning operation of the pattern generator in FIG. 1, according to an exemplary embodiment of the inventive concept. FIG. 5 is a block diagram illustrating a control unit of the pattern generator in FIG. 1, according to an exemplary embodiment of the inventive concept.

Referring to FIGS. 1 to 5, a pattern generator 10 may include a pattern generating system 100 for writing (e.g., generating) a pattern described in pattern data. The pattern generator 10 may write the pattern by scanning a plurality of exposure beams in parallel scan lines while moving along scan strips in a direction perpendicular to the scan lines. The pattern generator 10 may include a control unit 200 for generating pattern data having an optimized beam arrangement, and converting the pattern data into a control signal for the pattern generating system 100.

In an exemplary embodiment of the inventive concept, the pattern generator 10 may generate a pattern on a substrate using a plurality of the exposure beams. The pattern generator 10 may be a micro-lithographic writing device for writing on a substrate having a photosensitive material deposited thereon. The term "writing" may be understood in a broad sense, meaning, for example, exposure of photoresist and photographic emulsion. In addition, "writing" may also refer to an effect caused or action resulting from the illumination of a light beam or heat of the light beam on a light sensitive medium, or the effect caused or action resulting from the emission of particles toward a particle sensitive medium.

For example, the pattern generator 10 may be a laser scanning pattern generator. However, it may be understood that the pattern generator 10 may include other exposure means, for example, light from infrared (IR) to extreme ultraviolet (EUV), x-ray or particle beams such as electron, ion or atom beams, and the like. The pattern generator 10 may be used to produce a mask or reticle for the production of a cyclic pattern of a display device. Further, the pattern generator 10 may be used to write such a cyclic pattern of a display device or other semiconductor device.

The pattern generating system 100 may include a laser beam source for generating a plurality of beams, a modulator 113 for controlling an intensity of the laser beams to produce a desired pattern, and a scanning device for directing the beams towards an object such as a mask M and performing scanning (e.g., writing) operations.

The laser beam source may include a laser source 110 and a diffraction optical element (DOE) 120. The laser source 110 may generate a laser beam having an output wavelength of, for example, 413 nm. The laser source 110 may output a continuous laser beam or a pulsed laser beam. The DOE 120 may separate the single laser beam into a plurality of laser beams, for example, 11 beams. However, the number of the laser beams is not limited thereto.

A modulator lens assembly 111 may be disposed between the laser source 110 and the modulator 113. The modulator lens assembly 111 may focus each individual laser beam into the modulator 113.

The modulator 113 may modulate the incoming focused plurality of laser beams. The modulator 113 may change the intensity of the focused laser beams and/or the period of illumination time. The modulator 113 may include an acousto optical modulator (AOM). The modulator 113 may be controlled according to input data. At least one prism 114 may be included in the pattern generating system 100 for compressing the extension of the optical path of the laser beam.

The scanning device may include a deflector 116 used for the scanning operations. The deflector 116 may include an acousto optical deflector (AOD). The AOD may deflect the laser beams onto the mask M to form scan lines. The AOD may create a sweep along the scan lines. A lens 115 may focus the plurality of the beams onto the mask M.

As illustrated in FIG. 2, a stage 102 may support and move a substrate such as the mask M. The deflector 116 may be installed on a carriage 132, and the carriage 132 may be free to slide along a guide rail 130 in a first direction (X direction). Accordingly, the deflector 116, together with the carriage 132, may be free to slide along the guide rail 130. The guide rail 130 may be moved in a stepwise or continuous fashion along a second direction (Y direction) perpendicular to the first direction by a servo-mechanism. Thus, the carriage 132 may be moved in a stepwise or continuous fashion along the Y direction. The stage 102 may be moved along the X direction or the Y direction by actuators.

The control unit 200 may include a clock generator. The clock generator may generate a clock signal, which synchronizes operation of a data delivery device, the modulator 113 and the deflector 116. The control unit 200 may provide for accurate positioning of the guide rail 130 with respect to the stage 102. The control unit 200, as described later, may read pattern data and output a control signal to an actuating unit 104 for controlling a movement of the guide rail 130.

As illustrated in FIGS. 3 and 4, the pattern generator 10 may generate a scan line. For example, several hundred pixels may be written in the Y direction for each position on the X direction along the guide rail 130. Numerous scan lines (sweeps) may form a scan strip. One pattern may include numerous scan strips. The scan strips may partially overlap each other or might not overlap each other, depending on the writing strategy chosen. A length of a scan line, e.g., a width L of a scan strip may be about 210 μm, and a width W of the sweep may be about 250 nm or about 350 nm. However, it is understood that the length L of the scan line and the width W of the sweep are not limited thereto.

Accordingly, the pattern generator 10 may scan a plurality of the beams on the substrate in a direction (the Y direction) parallel with the scan lines while the pattern generator 10 moves along the scan strips in a direction (the X direction) perpendicular to the scan lines.

As illustrated in FIG. 5, the control unit 200 of the pattern generator 10 may generate pattern data for generating (writing) a pattern on a substrate, convert the pattern data into a control signal in a digital file format, and output the control signal to the modulator 113, the deflector 116 and the actuating unit 104.

In an exemplary embodiment of the inventive concept, the control unit 200 may include a pattern data generator 210, a bit map generator 220 and a pattern data determiner 230.

The pattern data generator 210 may receive design pattern data from a computer aided design (CAD) system and generate pattern data based on the design pattern data. Additionally, the pattern data generator 210 may generate new pattern data based on pattern information corrected by the pattern data determiner 230. The pattern data may be in a hierarchical vector format.

For example, the design pattern data may be design data of a pattern to be formed in a mask M and may be represented by a coordinate value of the profile of the pattern. The pattern data may be used when a plurality of beams is directed on the mask M by the pattern generator 10 to write the pattern. The pattern data may include a combination of polygons (triangles, rectangles, etc). In the pattern data, a plurality of sub-patterns have polygonal shapes which form one pattern. The pattern data may include information about sizes and positions of the sub-patterns.

The bit map generator 220 may generate a bit map in a digital file format from the pattern data. The bit map may be in a rasterized (bitmap) format, that in turn can be translated into control signals for the modulator 113 and the deflector 116. The bit map generator 220 may divide the pattern data into a plurality of grids (pixels) and binarize each of the grids corresponding to the pattern. Binarizing the grids means determining whether each grid is part of the pattern or not. The bit map may be a gray level bit map representing a ratio of a pattern occupying each grid. For example, each binarized grid in the bit map may represent a value that is equal to an area of the pattern that occupies the grid over the area of the grid.

A plurality of the beams may be set to correspond to the grids, respectively, which are arranged in one row in the bit map. The beam corresponding to each of the grids may be scanned along a direction (the Y direction) parallel with the scan line through the sweep. For example, 11 beams may be generated and the generated beams may be set to correspond to the grids, respectively, which are arranged in the same row of the bit map. Each grid in the bit map may represent information of one of the plurality of the beams corresponding thereto, which is to be scanned and the intensity of the beam.

The pattern data determiner 230 may analyze characteristics of the beams corresponding to the grids and determine whether the pattern data has to be changed to have an optimized beam arrangement for each grid.

The pattern data determiner 230 may detect the characteristics of the beams corresponding to each of the grids, and determine whether the beams satisfy (e.g., are equal to or greater than) predetermined characteristic values, respectively. For example, the pattern data determiner 230 may analyze the beam intensity or the position and the size of the beam spot for the 11 beams corresponding to each of the grids. In addition, the pattern data determiner 230 may select at least one of the beams having preferable characteristics.

The pattern data determiner 230 may perform a simulation to analyze which portion of the pattern will actually be exposed according to a distribution of the beams for each grid in the bit map. In addition, the pattern data determiner 230 may determine which portion of the pattern will be exposed to the beam having the preferable characteristics. As a result of the simulation, when it is determined that a critical position (e.g., an important portion) of the pattern, e.g., an edge portion of the pattern, will be exposed to a beam having less desirable characteristics, the pattern data determiner 230 may perform a correction of the pattern data. For example, the critical position of a pattern may be a portion of a pattern that needs to be scanned by a beam having preferable characteristics.

In this case, the pattern data determiner 230 may correct pattern information in the pattern data such that a beam having preferable characteristics is set to correspond to the grid corresponding to the critical position of the pattern. For example, the pattern information may include information about the position of the pattern or the size of the pattern in the pattern data.

The pattern data generator 210 may receive the corrected pattern information from the pattern data determiner 230 and may generate a second pattern data having a new beam arrangement. The bit map generator 220 may generate a second bit map from the second pattern data. The pattern data determiner 230 may analyze a beam arrangement for each grid of the second bit map and determine whether the second pattern data has to be changed.

The pattern data determiner 230 may perform the pattern data correction process repeatedly until the pattern data having a desired optimized beam arrangement is found. The pattern data determiner 230 may output the control signal determined through the optimizing simulation to the modulator 113, the deflector 116 and the actuating unit 104.

Hereinafter, a method of exposing a mask using the pattern generator will be explained.

Figure 6:
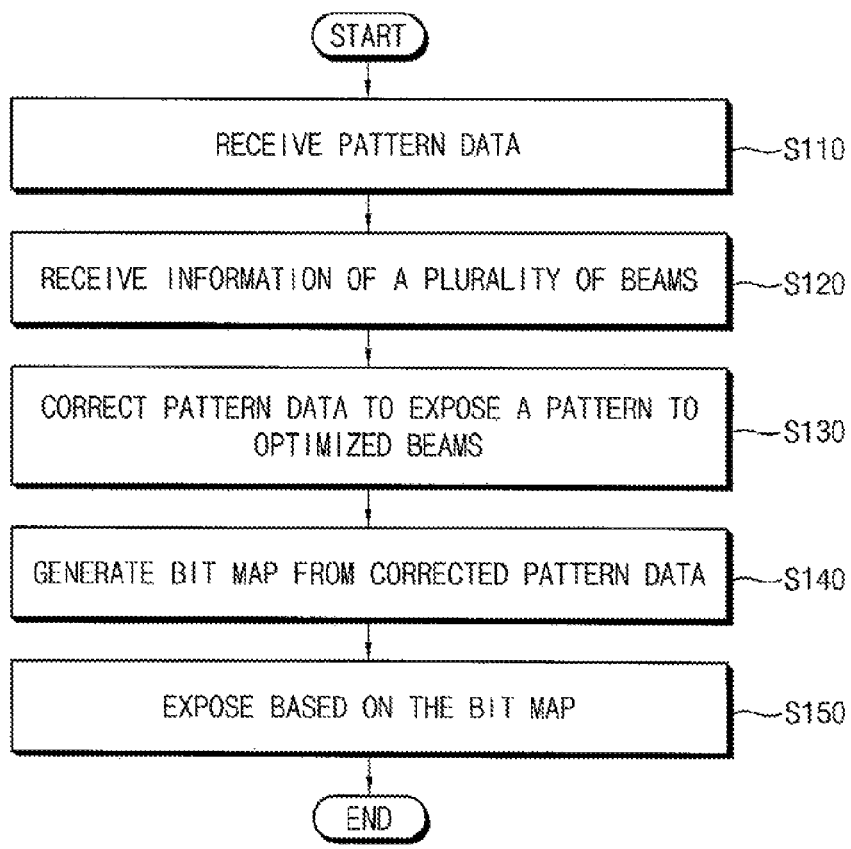
FIG. 6 is a flowchart illustrating a pattern generating method in accordance with an exemplary embodiment of the inventive concept.
Figures 7, 8:
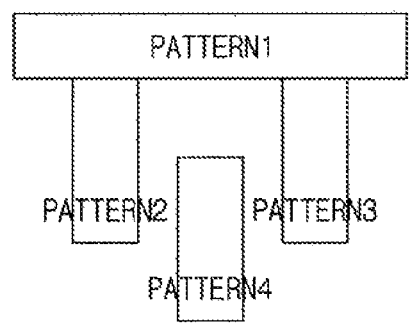
FIG. 7 is a plan view illustrating a first pattern data in accordance with an exemplary embodiment of the inventive concept.
FIG. 8 is a plan view illustrating a first bit map generated from the first pattern data of FIG. 7, according to an exemplary embodiment of the inventive concept.
Figures 9, 10:
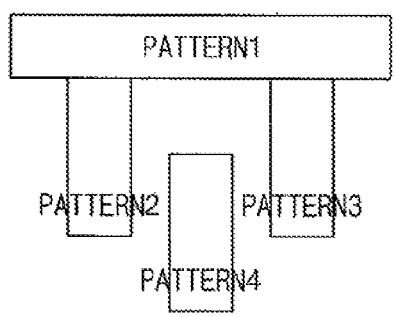
FIG. 9 is a plan view illustrating a gray level of the first bit map of FIG. 8, according to an exemplary embodiment of the inventive concept.
FIG. 10 is a plan view illustrating a second pattern data corrected from the first pattern data, according to an exemplary embodiment of the inventive concept.

FIG. 6 is a flowchart illustrating a pattern generating method in accordance with an exemplary embodiment of the inventive concept. FIG. 7 is a plan view illustrating a first pattern data in accordance with an exemplary embodiment of the inventive concept. FIG. 8 is a plan view illustrating a first bit map generated from the first pattern data of FIG. 7, according to an exemplary embodiment of the inventive concept. FIG. 9 is a plan view illustrating a gray level of the first bit map of FIG. 8, according to an exemplary embodiment of the inventive concept. FIG. 10 is a plan view illustrating a second pattern data corrected from the first pattern data, according to an exemplary embodiment of the inventive concept. FIG. 11 is a plan view illustrating a second bit map generated from the second pattern data, according to an exemplary embodiment of the inventive concept.

Referring to FIGS. 6 to 11, a pattern data of a pattern to be generated by a pattern generator may be received (S110).

In an exemplary embodiment of the inventive concept, design pattern data may be received from a CAD system, and a first pattern data may be generated based on the design pattern data.

For example, the design pattern data may be design data of a pattern to be formed in a mask M and may be represented by a coordinate value of the profile of the pattern. The first pattern data may be used when a plurality of beams is directed on the mask M by the pattern generator 10 in FIG. 1 to write the pattern. The first pattern data may include a combination of polygons (triangles, rectangles, etc). The first pattern data may include a plurality of sub-patterns having polygonal shapes which form one pattern. The first pattern data may include information about sizes and positions of the sub-patterns.

As illustrated in FIG. 7, a first sub-pattern (PATTERN 1), a second sub-pattern (PATTERN 2), a third sub-pattern (PATTERN 3) and a fourth sub-pattern (PATTERN 4) may constitute a pattern to be formed on the mask M.

Then, characteristics of a plurality of the beams to be scanned on an object, for example, the mask M, according to the first pattern data, may be analyzed (S120).

In an exemplary embodiment of the inventive concept, after a first bit map is generated from the first pattern data, the characteristics of the plurality of the beams set to correspond to each of the divided grids in the first bit map may be analyzed.

The first bit map may be in a rasterized (bitmap) format that in turn can be translated into control signals for the modulator 113 and the deflector 116 of the pattern generator 10. For example, in an exemplary embodiment of the inventive concept, the first bit map may be used to control the properties of the beams to be scanned on the mask M. The first pattern data may be divided into a plurality of grids (pixels) and each of the grids may be binarized to correspond to the pattern to generate the first bit map. Additionally, the first bit map may be a gray level bit map representing a ratio of a pattern occupying each grid. Accordingly, each grid in the first bit map may represent information of one of the plurality of the beams to be scanned and the intensity of the beams.

The plurality of the beams to be scanned on the mask M may be set to correspond to the grids, respectively, which are arranged in one row in the first bit map. The beam corresponding to each of the grids may be scanned along a direction (the Y direction) parallel with the scan line through the sweep.

As illustrated in FIG. 8, the laser beam source of the pattern generator 10 may generate 11 beams, and the generated beams may be set to correspond to the grids of the first bit map, respectively, which are arranged in the same row. For example, beams 1, 10, 8, 6, 4, 2, 11, 9, 7, 5, 3, 1, and 10 may be set to correspond to the grids which are arranged sequentially in the same row of the first bit map. Each of the beams may sweep by the length of the scan line. However, it is understood that the order of the beams is not limited to the particular arrangement discussed herein.

As illustrated in FIG. 9, each grid in the first bit map may represent a dose, for example, a value, of a characteristic of a beam (e.g., beam intensity, beam spot size, luminosity, etc.) of each of the scanned beams. For example, in the first bit map, 1 may represent a dose of 100%, 0.5 may represent a dose of 50%, and the like.

The characteristics of the beams corresponding to the grids in the first bit map, respectively, may be detected to determine whether the beams satisfy predetermined characteristic values. As illustrated in FIG. 8, the beam intensity or the position and the size of the beam spot for the 11 beams corresponding to each of the grids may be analyzed to determine the beam having preferable characteristics. For example, it may be determined that the fourth beam (beam 4) and the fifth beam (beam 5) have less desirable characteristics.

Then, the first pattern data may be corrected to expose at least a portion of the pattern with optimized beams (8130).

In an exemplary embodiment of the inventive concept, a simulation may be performed to analyze which portion of the pattern will be actually exposed according to a distribution of the beams for each grid in the bit map and to determine which portion of the pattern will be exposed to the beams having preferable characteristics. As a result of the simulation, when it is determined that a critical position (e.g., important portion) of the pattern, e.g., an edge portion of the pattern, will be exposed to a beam having less desirable characteristics, a correction of the first pattern data may be performed.

As illustrated in FIG. 10, for example, when it is determined that the critical position of the pattern (the edge portion of the pattern) will be exposed to beam 4 and beam 5 having the less desirable characteristics, the first pattern data may be corrected to generate a second pattern data. In this case, pattern information in the second pattern data may be corrected such that a beam having preferable characteristics is set to correspond to a grid of a second bit map corresponding to the critical position of the pattern. For example, the pattern information may include information about the position of the pattern or the size of the pattern in the second pattern data.

Then, the second bit map may be generated from the second pattern data (S140). Then, an exposure may be performed on the mask M according to the generated second bit map (S150).

In an exemplary embodiment of the inventive concept, a third bit map may be generated from the second pattern data, and then, a beam arrangement for each grid of the third bit map may be analyzed to determine whether the critical position of the pattern will be exposed to the beam having preferable characteristics.

As illustrated in FIG. 11, beam 4 and beam 5 having the less desirable characteristics may be prevented from exposing the critical portion (e.g., the edge portion) of the pattern, and beam 6 and beam 7 having the preferable characteristics may be set to expose the critical portion of the pattern.

The pattern data correction process may be performed repeatedly until the pattern data having a desired optimized beam arrangement is found. A bit map determined through the optimizing simulation may be used to perform an exposure process on the mask M.

In an exemplary embodiment of the present invention, the first and second bit maps may be compared and the bit map having the most optimized beam arrangement, from among the first and second bit maps, may be selected for performing an exposure process on the mask M. According to an exemplary embodiment of the inventive concept, the bit map having the most optimized beam arrangement is the bit map having the largest number of critical positions of the pattern(s) set to be scanned by beams having preferable characteristics. According to an exemplary embodiment of the inventive concept, the bit map having the most optimized beam arrangement is the bit map having the beam with the highest characteristics (e.g., characteristics that exceed the predetermined threshold value the most, in comparison to the other beams) set to scan a critical position of a pattern.

As mentioned above, in the pattern generating method and apparatus in accordance with an exemplary embodiment of the inventive concept, before performing an exposure process, a pattern data may be analyzed to evaluate qualities of a plurality of beams to actually be scanned. The pattern data may be corrected such that the beams having preferable characteristics may be set to expose a critical pattern or a critical portion (e.g., an edge portion) of the pattern. Then, an exposure process may be performed using the beams set at corrected positions according to the corrected pattern data.

Thus, mura may be reduced or prevented. Accordingly, excellent photomasks may be manufactured without reducing productivity.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A pattern generating method, comprising:
   generating a first bit map from inputted pattern data;
   analyzing characteristics of a plurality of beams for exposing a pattern on a substrate, each of the plurality of beams being designated to correspond to one of a plurality of grids in the first bit map;
   correcting the pattern data such that at least one of the plurality of beams is designated to expose at least a portion of the pattern on the substrate;
   generating a second bit map from the corrected pattern data; and
   patterning the substrate using the plurality of beams according to the designation of the second bit map.

2. The pattern generating method of claim 1, wherein analyzing the characteristics of the plurality of beams comprises:

generating the plurality of beams which is designated to correspond to each of the grids in the first bit map; detecting characteristics of each of the generated plurality of beams; and selecting at least one of the plurality of beams which has a characteristic value that is equal to or greater than a predetermined characteristic value.

3. The pattern generating method of claim 1, wherein analyzing the characteristics of the plurality of beams comprises analyzing a beam intensity, or a position and size of a beam spot, for each of the plurality of beams.

4. The pattern generating method of claim 1, wherein correcting the pattern data comprises correcting pattern information in the pattern data such that the at least one of the plurality of beams is set to correspond to a predetermined grid of the second bit map.

5. The pattern generating method of claim 4, wherein the predetermined grid of the second bit map corresponds to a portion of the pattern to be scanned by the at least one of the plurality of beams, wherein the at least one of the plurality of beams has a characteristic value equal to or greater than a predetermined characteristic value.

6. The pattern generating method of claim 4, wherein, in the pattern data, the pattern information comprises information about a position of the pattern or a size of the pattern.

7. The pattern generating method of claim 1, wherein generating the first bit map comprises: dividing the pattern data into the plurality of grids; and binarizing each of the grids to correspond to the pattern.

8. The pattern generating method of claim 1, wherein patterning the substrate using the plurality of beams comprises: designating the plurality of beams, respectively, to correspond to the grids arranged in one row in the second bit map; and scanning the beams along a direction parallel with scan lines through a sweep.

9. The pattern generating method of claim 1, wherein each grid in the first bit map represents information of one of the plurality of beams to be scanned and the intensity of the one of the plurality of beams.

10. The pattern generating method of claim 1, wherein patterning the substrate using the plurality of beams comprises exposing a photosensitive layer on the substrate with the plurality of beams.

11. A pattern generating method, comprising:
analyzing characteristics of a plurality of beams configured to expose a substrate at predetermined positions according to inputted pattern data, correcting the pattern data such that at least one of the plurality of beams is designated to expose at least a portion of a pattern on the substrate; and patterning the substrate by exposing the substrate with the plurality of beams according to corrected positions of the plurality of beams, wherein the corrected positions of the plurality of beams are determined using the corrected pattern data, and wherein correcting the pattern data comprises:
generating a digital file format from the pattern data, the digital file format including information of each of the plurality of beams, wherein each of the plurality of beams is set to correspond to one of a plurality of grids of a first bit map, wherein the predetermined positions correspond to the plurality of grids of the first bit map; and correcting pattern information in the pattern data such that the at least one of the plurality of beams is designated to correspond to one of a plurality of predetermined grids of a second bit map, wherein the second bit map includes the corrected positions of the plurality of beams.

12. The pattern generating method of claim 11, wherein analyzing the characteristics of the plurality of beams comprises: generating the plurality of beams; detecting characteristics of the generated plurality of beams; and selecting at least one of the plurality of beams which has a characteristic value that is equal to or greater than a predetermined characteristic value.

13. The pattern generating method of claim 11, wherein analyzing the characteristics of the plurality of beams comprises analyzing a beam intensity, or a position and size of a beam spot, for each of the plurality of beams.

14. A pattern generating method, comprising:
analyzing characteristics of a plurality of beams configured to expose a substrate at predetermined positions according to inputted pattern data, correcting the pattern data such that at least one of the plurality of beams is designated to expose at least a portion of a pattern on the substrate; and patterning the substrate by exposing the substrate with the plurality of beams according to corrected positions of the plurality of beams, wherein the corrected positions of the plurality of beams are determined using the corrected pattern data, and wherein correcting the pattern data comprises:
generating a first bit map from the pattern data, the first bit map including characteristics of each of the plurality of beams, wherein the plurality of beams is set to correspond to a plurality of grids of the first bit map, respectively;

correcting pattern information in the pattern data to generate a second bit map, the second bit map including the characteristics of each of the plurality of beams, wherein the plurality of beams is set to correspond to a plurality grids of the second bit map, respectively; and comparing the first bit map and the second bit map, and selecting one of the first and second bit maps to expose an edge of the pattern, wherein the selected first or second bit map includes the beam having a characteristic value that exceeds a predetermined characteristic value by a greater value than any of the other beams of the plurality of beams.

* * * * *